United States Patent
Sindzingre et al.

[11] Patent Number: 5,858,312
[45] Date of Patent: Jan. 12, 1999

[54] GAS EXCITATION DEVICE

[75] Inventors: Thierry Sindzingre, Cachan; Stéphane Rabia, Gif Sur Yvette, both of France

[73] Assignee: L'Air Liquide, Societe Anonyme pour L'Etude Et l'Exploitation des Procedes Georges Claude, Paris, France

[21] Appl. No.: 877,914

[22] Filed: Jun. 18, 1997

[30] Foreign Application Priority Data

Jul. 2, 1996 [FR] France ................................. 96 08229

[51] Int. Cl.$^6$ .............................. C01B 13/11; B01J 19/12
[52] U.S. Cl. ............................... 422/186.04; 422/186.29
[58] Field of Search ....................... 422/186.04, 186.29

[56] References Cited

U.S. PATENT DOCUMENTS

| | | | |
|---|---|---|---|
| 5,002,739 | 3/1991 | Ditzler et al. | 422/186.19 |
| 5,034,198 | 7/1991 | Kaiga et al. | 422/186.07 |
| 5,458,856 | 10/1995 | Marie et al. | 422/186 |

FOREIGN PATENT DOCUMENTS

| | | |
|---|---|---|
| 658391 | 6/1995 | European Pat. Off. . |
| 721749 | 5/1942 | Germany . |
| 477905 | 10/1969 | Switzerland . |
| 955702 | 4/1964 | United Kingdom . |
| 1137029 | 12/1968 | United Kingdom . |

Primary Examiner—Daniel J. Jenkins
Attorney, Agent, or Firm—Burns, Doane, Swecker & Mathis, L.L.P.

[57] ABSTRACT

A gas excitation device, comprising a gas excitation chamber comprising a gas inlet passage defining a path of gas in communication with a primary gas supply sources, an outlet passage for excited gas, a venturi-effect constriction arranged on the path of the gas between the primary supply source and the inlet passage, and at least one secondary gas supply source in communication with a region located downstream of the constriction, the gas delivered by the secondary source being entrained by venturi effect into the excitation chamber under the effect of the gas delivered by the primary source.

12 Claims, 2 Drawing Sheets

GAS EXCITATION DEVICE

BACKGROUND OF THE INVENTION (i) Field of the Invention

The present invention relates to a device for gas excitation with a view to the formation of excited or unstable gas molecules, which is in particular designed for the excitation of gases used in the field of surface treatment, or alternatively effluent gas treatment (ii) Description of Related Art Gas excitation devices are known in the prior art, of the type comprising a gas excitation chamber provided with a gas inlet passage in communication with a primary gas supply source, and an outlet passage for excited gas.

This type of excitation device makes it possible to transfer chemical and heat energy to a gas from electrical energy, while operating at a temperature close to ambient temperature.

During operation, this device needs a high gas consumption in order to ensure rapid transport of chemically activated species to a region where they are used (minimizing the time of "flight" between the inlet of gas into the device and the arrival of the excited species on the surface to be treated, when considering the example of a surface treatment).

Such gas consumption considerably impairs the economic benefit of a device of this type. For example, there are clear difficulties in adapting processes of this type to the treatment of mass-produced articles, as is the case in the automotive industry, or in the glass industry, where the extra cost of the gas consumption is not always tolerable.

The object of the invention is to overcome this drawback and to provide a gas excitation device which exhibits low gas consumption and furthermore allows intake of an addition gas mixture upstream of the gas excitation chamber.

SUMMARY AND OBJECTS OF THE INVENTION

Its subject is therefore a gas excitation device of the aforementioned type, characterized in that it includes a venturi-effect constriction arranged on the path of the gas between the primary supply source and the inlet passage, and in that it furthermore includes at least one secondary gas supply source in communication with a region located downstream of the said constriction, the gas delivered by the said secondary source being entrained by venturi effect into the said excitation chamber under the effect of the gas delivered by the primary source.

It is clear that a device of this type makes it possible, in particular, to tackle the following situations:

- the surface treatment of objects under economical gas-consumption conditions: to this end, consideration may be given to using, as secondary gas source, the excited treatment gas used to perform the surface treatment (the secondary gas resulting from the conversion of the primary gas inside the excitation device, which can thus be recycled to the inlet passage);
- the treatment (decontamination) of effluent gases: the secondary gas source may then consist of the effluent, entrained by the primary gas into the excitation chamber with a view to its reprocessing, before being discharged from the device through the gas outlet passage to be reused or else discharged to the outside.

The effluent gases to be reprocessed in this way may, according to the invention, originate from widely varied operations which produce effluents of this type.

By way of illustration, but without implying any limitation, mention may be made of the case of metal-soldering furnaces, or furnaces which carry out heat-treatment operations on metals or ceramics, or continuous furnaces carrying out operations referred to as "reflow soldering", which are operations of soldering components onto electronic circuits using a soldering paste whose formulation includes, further to the metal alloy which makes the soldered joint, solvents and other, more or less resinous, chemical fluxes which facilitate wetting. In the atmosphere inside the furnace, the temperature rise then causes significant releases, in particular of solvents and other organic components which it is advantageous to be able to remove, whether before discharging the atmosphere to the outside, or in order to recycle it in order to reuse it.

The invention may furthermore include one or more of the following characteristics:

- the excitation device includes a gas recirculation channel connecting a closed volume, located downstream of the excitation chamber, and the said region arranged downstream of the venturi-effect constriction, the said secondary gas supply source being constituted by the said closed volume;
- the said secondary gas supply source is constituted by an addition gas supply source connected, by a gas intake channel, to the said region arranged downstream of the venturi-effect constriction, the said addition gas being intended to be mixed, upstream of the excitation chamber, with the gas delivered by the said primary source, for example in order to form, after excitation, a surface-treatment gas, or, for example, in order to be decontaminated (effluent) inside the device;
- the primary gas supply source is constituted by an inert gas supply source, the said secondary source being constituted by an active gas supply source;
- the excitation device includes, connected to a high-frequency AC high-voltage source, a first, internal exciting electrode of cylindrical shape, and a second, external exciting electrode which is of cylindrical shape and is provided with substantially opposite longitudinal slots constituting the said gas inlet and outlet passages, the said first and second exciting electrodes being arranged coaxially and delimiting the said gas excitation chamber, a layer of a dielectric material being arranged on the surface of at least one of the electrodes, facing the other electrode;
- the excitation device includes at least one homogenization chamber, arranged at the outlet of at least one of the said primary and secondary sources, with a view to uniformly distributing the gas delivered to the said excitation chamber;
- the excitation device includes a gas feed conduit comprising a first, internal cylinder, provided with a first end connected to the primary gas supply source and with a closed opposite end and including a longitudinal slot, and a second, external cylinder, coaxial with the said first cylinder, provided with closed opposite end regions and including a longitudinal gas-distributing slot in communication with the said gas inlet passage and extending on the opposite side from the slot formed in the said first cylinder, with a view to uniformly distributing the gas delivered to the said excitation chamber.

Other characteristics and advantages of the invention will emerge from the following description, given solely by way of example and made with reference to the appended drawings, in which:

DETAILED DESCRIPTION OF PREFERRED EMBODIMENTS

Figure 1:
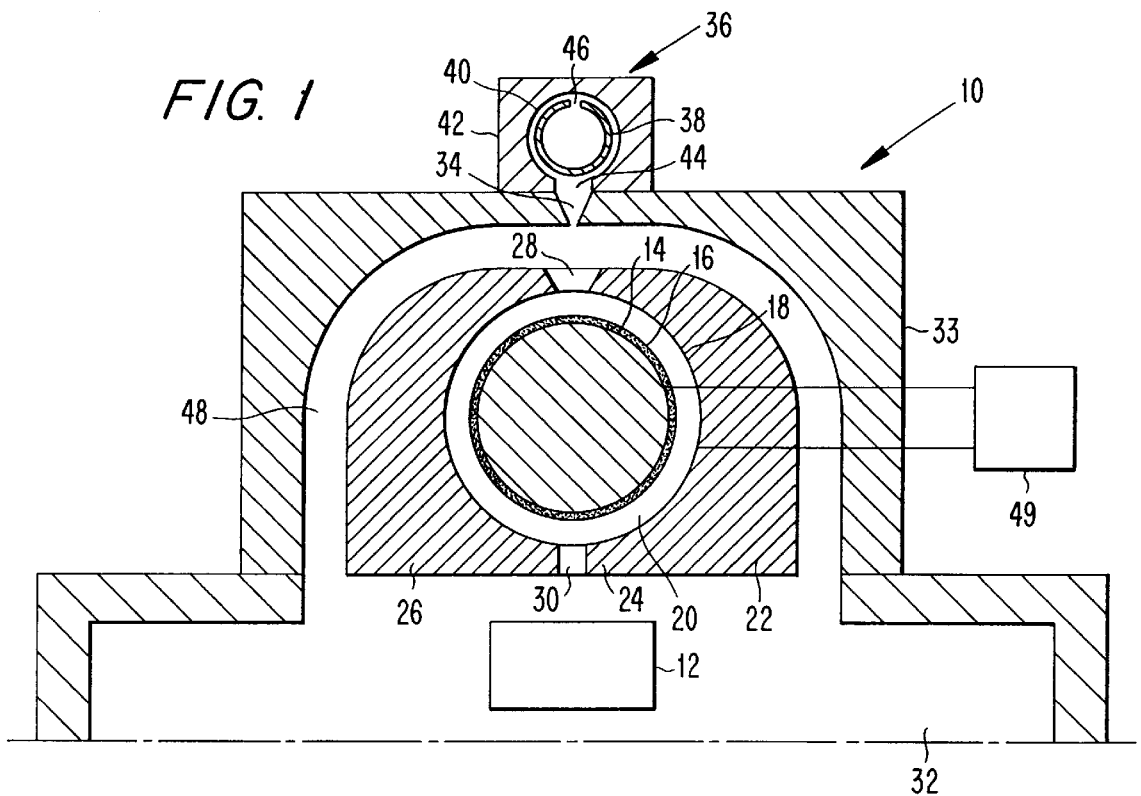
FIG. 1 is a schematic view in cross-section of an excitation device according to the invention.

FIG. 1 represents an excitation device according to the invention, denoted by the general numerical reference 10.

The embodiment exemplified here may, for example, be intended for exciting a gas delivered by a primary gas supply source, with a view to performing a surface treatment of an article 12.

This FIG. 1 shows that the excitation device includes a first, internal exciting electrode 14, of cylindrical shape, externally coated with a layer 16 of dielectric material and arranged inside a second, external exciting electrode, also of cylindrical shape 18. The two exciting electrodes 14 and 18 are arranged coaxially and delimit between them a gas excitation chamber 20.

The second, external electrode 18 is formed by the internal face of a longitudinal metal block 22 consisting of the combination of two complementary parts 24 and 26 arranged facing and spaced apart from one another.

The two parts 24 and 26 are separated from one another by two passages 28 and 30, respectively constituting a passage 28 for inlet of gas into the excitation chamber 20, and a gas outlet passage 30 in communication with a closed space 32 in which the article 12 to be treated is placed.

FIG. 1 also shows that the metal block 22 is arranged in a cage 33 provided with a longitudinal slot 34 arranged in front of the inlet passage 28 of the excitation chamber 20 and in communication with a gas feed conduit 36 connected to the primary gas supply source.

The width of the constriction 34 (here represented in the form of a slot) is advantageously substantially less than that of the inlet passage 28. A ratio between the two widths of between 1 and 3 will preferably be used.

The gas feed conduit 36 includes a first, internal cylinder 38, coaxial with the rest of the device and arranged inside a second cylinder 40, consisting of the cylindrical internal wall of a casing 42.

The casing 42 is provided with a longitudinal slot 44 extending parallel to the axis of the first cylinder 38 and in communication with the longitudinal slot 34 of the cage 33.

Furthermore, the first cylinder is provided with an opening 46 parallel to the opening 44 and arranged on the opposite side therefrom.

The first cylinder 38 has a first end, located to the rear of the plane in FIG. 1, in communication with the gas supply source and a closed opposite end, located in front of the plane of FIG. 1.

The two opposite ends of the cylinder 40 are furthermore closed.

In addition, the constriction 34 of the cage 33 has here a substantially V-profile shape which, in known fashion, causes an increase in the speed of the gas delivered by the gas supply source to the excitation chamber 20, as well as a corresponding reduction in the pressure of this gas (essentially in the vicinity of the passage 28).

The cage 33 and the metal block 22 are spaced apart and delimit a gas intake channel 48 extending between the gas inlet passage 28, downstream of the venturi-effect constriction 34, and the closed volume 32.

Finally, FIG. 1 shows that the device is completed by a high-frequency AC high voltage source 49, connected to the internal excitation electrode 14 and to the external excitation electrode 18, with a view to biasing them.

It is clear that, although the invention has as above been more particularly illustrated with the aid of venturi-effect constrictions which are in the form of slots, other configurations may be envisaged without in any way departing from the scope of the invention, for example, a row of orifices which may or may not be regularly spaced, or may have a determined and controlled spacing.

The device in FIG. 1 operates as follows.

The gas delivered by the supply source is supplied at a pressure of the order of a few bar. It flows into the first cylinder 38 of the gas feed conduit 36. It then passes through the orifice 46 then between the space delimited by the first cylinder 38 and the second cylinder 40, then into the slot 34. Along this route, the gas undergoes as it travels a relatively significant head loss designed to impart to this gas a homogeneous velocity and pressure distribution along the gas feed conduit 36, and therefore along the slot 34.

The gas then flows through the slot 34 and the passage 28, into the excitation chamber 20, in which it undergoes excitation in known fashion under the effect of the electrodes 16 and 18 supplied by the high-frequency AC voltage source 49.

The gas excited in this way then escapes through the outlet passage 30 with a view, for example, to the treatment of an article 12.

As mentioned above, under the effect of the venturi-effect constriction 34, the gas undergoes a pressure reduction downstream of this constriction.

This pressure reduction causes intake, by venturi effect, of the gas present in the intake channel 48, and therefore of the gas present in the closed volume 32.

It is therefore clear that, after the treatment of the article 12, the gas undergoes recirculation and is reinjected into the excitation chamber 20 with a view to its re-excitation.

The device which has just been described therefore allows a considerable saving on treatment gas since the de-excited gas present in the closed volume 32 constitutes a secondary supply source, the gas which it delivers being mixed with the gas delivered by the primary gas supply source.

Figure 2:
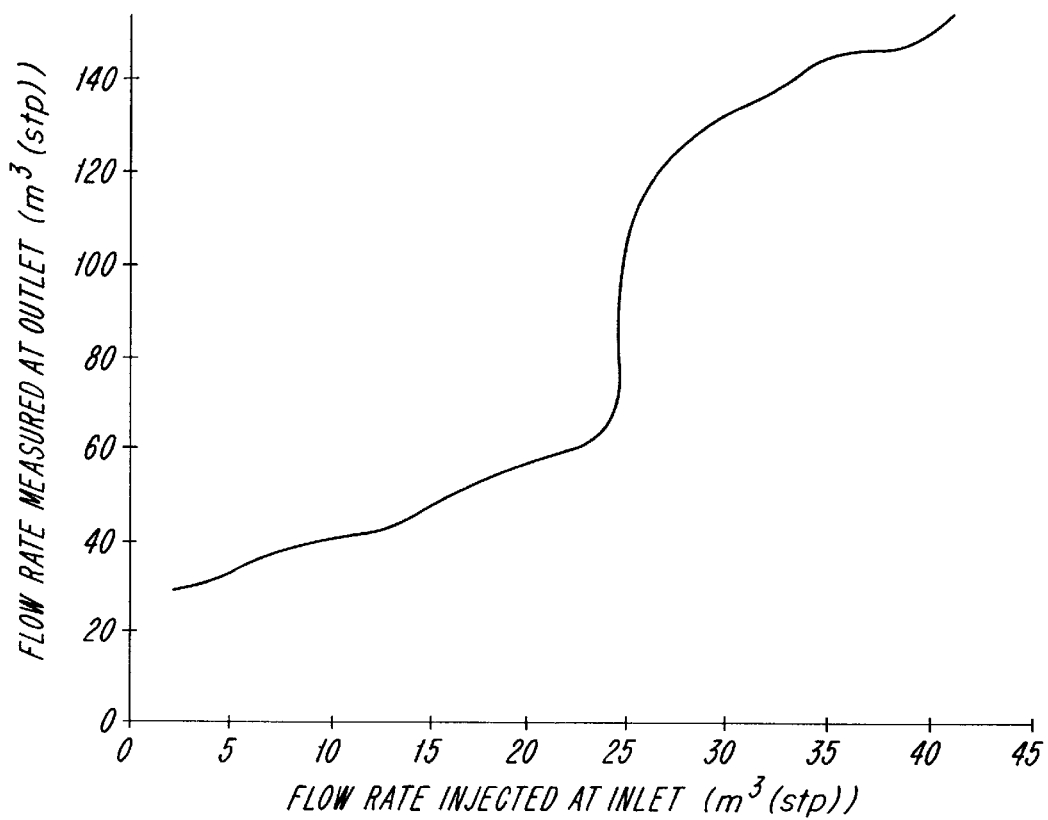
FIG. 2 is a curve of the gas flow rate measured at the outlet of the excitation chamber as a function of the gas flow rate delivered by the primary supply source.

FIG. 2, which represents a curve of the flow rate delivered at the outlet of the gas outlet passage 30 as a function of the flow rate injected through the gas feed conduit 36, shows that the device which has just been described allows a considerable saving on gas since, in order to obtain a gas flow rate of close to 30 m$^3$ (stp)/h at the outlet, for example, only 3 to 5 m$^3$ (stp)/h of gas need to be injected at the inlet.

Figure 3:
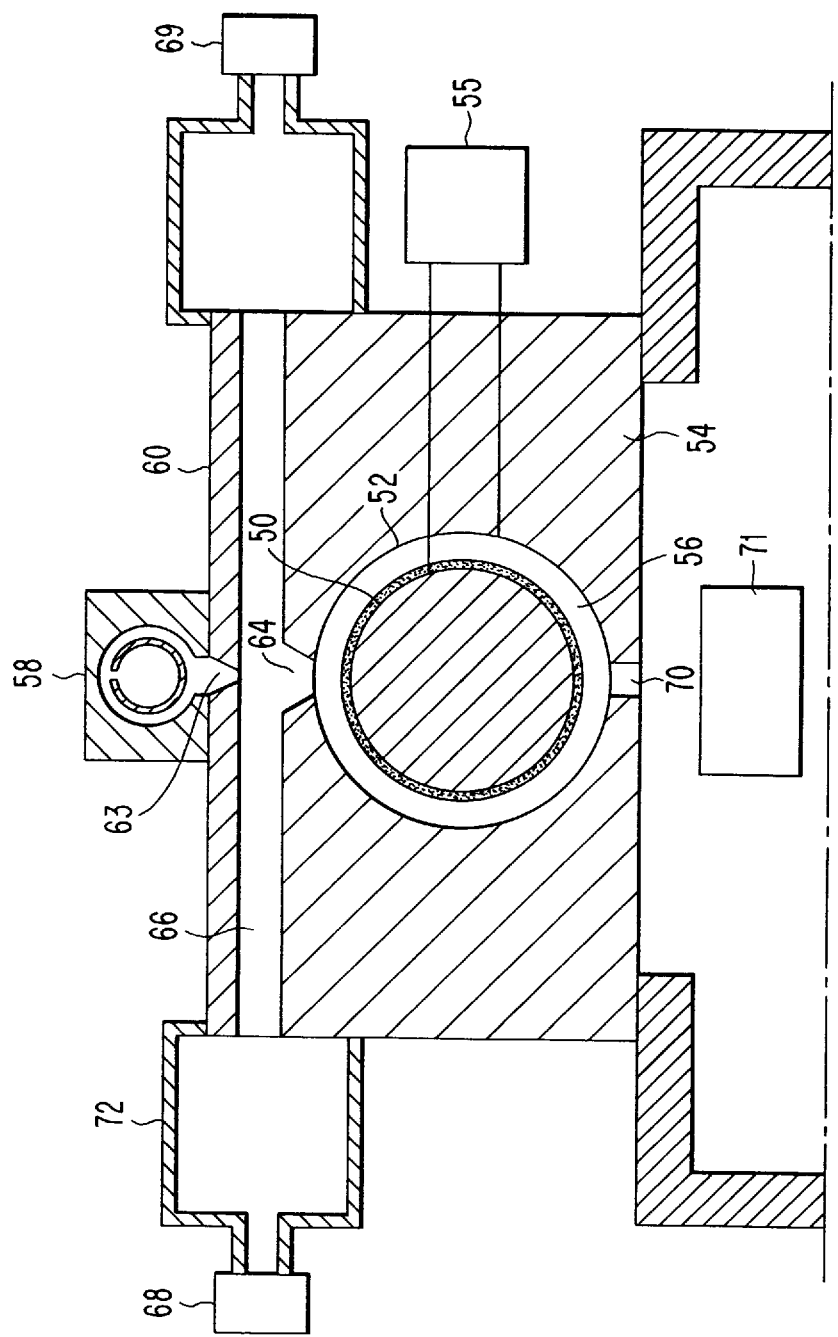
FIG. 3 is a schematic view in cross-section of an excitation device according to another embodiment.

FIG. 3 represents a gas excitation device according to another embodiment.

As in the previous illustrative embodiment, described with reference to FIG. 1, this excitation device includes a primary excitation electrode 50, coaxial with a secondary excitation electrode 52 formed by the internal wall of a two-part metal block 54 and delimiting an excitation chamber 56 in communication with a primary gas supply source via a gas feed conduit 58.

As before, the primary 50 and secondary 52 electrodes are connected to a high-frequency AC high voltage source 55 with a view to their excitation.

This FIG. 3 shows that the device furthermore includes a plate 60, superposed with the metal block 54 and spaced apart therefrom, as well as with the two excitation electrodes 50 and 52.

The plate 60 consists of the combination of two plates which are side-by-side and delimit a slot 63 forming a V-shaped venturi-effect constriction in communication with a passage 64 for inlet of gas into the excitation chamber 56.

The space delimited by the plate 60 and the metal block 54 constitutes a gas intake conduit 66 in communication with two gas supply sources 68 and 69, arranged on either side of the metal block 54 and delivering an addition gas or gas mixture intended, for example, to be mixed with the gas delivered by the primary source, with a view to its excitation by subsequent surface treatment.

As in the illustrative embodiment described with reference to FIG. 1, the gas delivered by the secondary supply sources 68 and 69 is sucked, by venturi effect, into the region located downstream of the constriction 63 and entrained into the excitation chamber 56, and escapes through an outlet passage 70 for excited gas to an article 71 to be treated.

It is therefore clear that, according to this embodiment, it is, for example, possible to mix a plurality of treatment gases in order to create excited chemical species of different gases with a view to carrying out a surface treatment of the article 71. A gas including at least one member of the groups formed by the inert gases, the oxidizing gases and the reducing gases, may therefore be envisaged both for the primary gas and also for the addition source.

It is, of course, possible to provide the device which has just been described with reference to FIG. 3 with a gas recirculation channel, as in the illustrative embodiment in FIG. 1.

It should be noted that each secondary gas supply source 68 and 69 is preferably associated with a homogenization chamber 72 with a view to permitting, in conventional function, a uniform distribution of the gas, in terms of velocity and pressure, in the conduit 66 with a view to its entrainment into the excitation chamber 56.

Of course, although the embodiment exemplified in FIG. 3 includes two secondary addition sources 68 and 69, it is perfectly conceivable to provide only one of them, without thereby departing from the scope of the present invention.

Similarly, although in conjunction with this FIG. 3 the application of "surface treatment of objects" has particularly been referred to, it is clear that the installation in FIG. 3, or a very similar installation (with one or more secondary sources) may be used for the treatment/decontamination of effluent gases, for example in the following context:

the secondary source consists of effluents to be treated (originating from any type of operation);

the effluents are entrained inside the discharge with a view to their reprocessing, under the effect of the primary gas which, for example, may be an inert gas or else a more active gas such as a reducing gas;

the effluents, once treated by the discharge, which are obtained at the gas outlet 70 are then, for example, reused for operation of the type which gave rise to them upstream, or alternatively discharged to the surrounding atmosphere.

We claim:

1. A gas excitation device, comprising
a gas excitation chamber comprising a gas inlet passage defining a path of gas in communication with a primary gas supply source, an outlet passage for excited gas, a venturi-effect constriction arranged on the path of the gas between the primary supply source and said inlet passage, and at least one secondary gas supply source in communication with a region located downstream of said constriction, the gas delivered by said secondary source being entrained by venturi effect into said excitation chamber under the effect of the gas delivered by the primary source.

2. The device according to claim 1 further comprising a gas recirculation channel connecting a closed volume located downstream of the excitation chamber and said region arranged downstream of the venturi-effect constriction, said secondary gas supply source being constituted by said closed volume (32).

3. The device according to claim 2 wherein said closed volume is constituted by an internal space delimited by an enclosure, in communication with said outlet passage for excited gas, within which a surface treatment of objects is carried out with the aid of the said excited gas.

4. The device according to claim 1, wherein said secondary gas supply source comprises an addition gas supply source connected, by a gas intake channel, to said region arranged downstream of the venturi-effect constriction (34;63), said device permitting admixture of said addition gas upsteam of the excitation chamber, with the gas delivered by said primary source.

5. The device according to claim 4 wherein said addition secondary gas source comprises an effluent gas that is to undergo a decontamination treatment inside the chamber.

6. The device according to claim 1, wherein the primary gas supply source comprises is an inert gas supply source and said secondary source comprises an active gas supply source.

7. The device according to claim 1, further comprising, connected to a high-frequency AC high-voltage source, a first, internal exciting electrode of cylindrical shape, and a second, external exciting electrode which is of cylindrical shape and is provided with substantially opposite longitudinal slots constituting said gas inlet and outlet passages, said first and second exciting electrodes being arranged coaxially and delimiting said gas excitation chamber, a layer of a dielectric material being arranged on the surface of at least one of the two electrodes, facing the other electrode.

8. The device according to claim 1, further comprising at least one homogenization chamber, arranged at an outlet of at least one of said primary and secondary sources, so as to uniformly distribute the gas delivered to said excitation chamber.

9. The device according to claim 1 further comprising a gas feed conduit comprising a first, internal cylinder, provided with a first end connected to the primary gas supply source and with a closed opposite end and including a longitudinal slot, and a second, external cylinder, coaxial with said first cylinder, provided with closed opposite end regions and including a longitudinal gas-distributing slot in communication with said gas inlet passage and extending on the opposite side from the slot (46) formed in said first cylinder, so as to uniformly distribute the gas delivered to said excitation chamber.

10. The device according to claim 1 wherein, said constriction is a substantially longitudinal slot whose width is substantially less than that of said inlet passage.

11. The device according to claim 1 wherein the primary gas source is at a pressure greater than or equal to 3 bar.

12. Device according to claim 1, wherein the gas delivered by the said primary and secondary gas supply sources includes at least one of inert gases, oxidizing gases and reducing gases.

* * * * *